(12) United States Patent
Shimizu et al.

(10) Patent No.: US 6,476,462 B2
(45) Date of Patent: Nov. 5, 2002

(54) MOS-TYPE SEMICONDUCTOR DEVICE AND METHOD FOR MAKING SAME

(75) Inventors: Tatsuo Shimizu, Ibaraki (JP); Mieko Matsumura, Ibaraki (JP); Shigenobu Kimura, Ibaraki (JP); Yutaka Hirose, Ibaraki (JP); Yasuhiro Nishioka, Ibaraki (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/732,132

(22) Filed: Dec. 7, 2000

(65) Prior Publication Data

US 2001/0030354 A1 Oct. 18, 2001

Related U.S. Application Data

(60) Provisional application No. 60/173,244, filed on Dec. 28, 1999.

(51) Int. Cl.$^7$ .......................... H01L 29/04; H01L 29/78
(52) U.S. Cl. .......................... 257/627; 257/30; 257/321
(58) Field of Search ........................... 257/30, 321, 627

(56) References Cited

U.S. PATENT DOCUMENTS

| 5,739,544 A | * | 4/1998 | Yuki ........................... 257/25 |
| 5,888,885 A | * | 3/1999 | Xie ............................ 438/493 |
| 6,339,015 B1 | * | 6/2002 | Bracchitta et al. .......... 438/519 |

OTHER PUBLICATIONS

S. M. Sze, "Basic Device Characteristics," Physics of Semiconductor Devices, Second Edition, pp. 433–456.

R. H. Dennard et al., "Design of Ion–Implanted MOSFET's with Very Small Physical Dimensions," IEEE Journal of Solid–State Circuits, vol. SC–9, No. 5, Oct. 1974, pp. 256–267.

H. S. Momose, "1.5 nm Direct–Tunneling Gate Oxide Si MOSFET's," IEEE Transactions on Electron Devices, vol. 43, No. 8, Aug. 1996, pp. 1233–1242.

J. H. Stathis et al., "Reliability Projecton for Ultra–Thin Oxides at Low Voltage," IEEE Tech. digest of IEDM (1998), p. 167–170.

Z. Lu et al., "Fourier transform infrared study of rapid thermal annealing of a—Si:N:H(D) films prepared by remote plasma–enhanced chemical vapor deposition," J. Vac. Sci. Technol. A 13(3), May/Jun. 1995, pp. 607–613.

D. R. Lee, "Reliability of nitrided Si–SiO2 interfaces formed by a new, low–temperature, remote–plasma process," J. Vac. Sci. Technol. B 13 (4), Jul./Aug. 1995, pp. 1788–1793.

M. L. Green et al., "Rapid thermal oxidation of silicon in N2O between 800 and 1200° C: Incorporated nitrogen and interfacial roughness," Appl. Phys. Lett. 65(7), Aug. 15, 1994, pp. 848–850.

(List continued on next page.)

*Primary Examiner*—Jerome Jackson
(74) *Attorney, Agent, or Firm*—Jacqueline J. Garner; W. James Brady III; Frederick J. Telecky, Jr.

(57) ABSTRACT

An MOS-type semiconductor device comprises two semiconductors separated by an insulator. The two semiconductors comprise monocrystal semiconductors, each having a crystallographic orientation with respect to the insulator (or other crystallographic/semiconductor property) different to the crystallographic orientation (or other respective property) of the other semiconductor. This arrangement of crystallographic orientations (and other crystallographic/semiconductor properties) can yield reduced unintended electron tunneling or current leakage through the insulator vis a vis a semiconductor device in which such an arrangement is not used. Methods for forming the MOS-type semiconductor devices of the invention are also provided.

13 Claims, 4 Drawing Sheets

OTHER PUBLICATIONS

J. Ahn et al., "Suppression of stress–induced leakage current in ultrathin N2O oxides," Appl. Phys. Lett. 60(22), Jun. 1, 1992, pp. 2809–2811.

H. Niimi et al., A New Low Thermal Budget Approach to Interface Nitridation for Ultra–Thin Silicon Dioxide Gate Dielectrics by Combined Plasma–Assisted and Rapid Thermal Processing, Proceedings of the 1998 International Conf. on Characterization and Metrology for ULSI Tech. 1998, pp. 273–277.

G. Lucovsky, "Ultrathin nitrided gate dielectrics: Plasma processing, chemical characterization, performance and reliability," IBM J. Res. Develop., vol. 43, No. 3, May 1999, pp. 301–326.

S. V. Hattangady et al., "Controlled nitrogen incorporation at the gate oxide surface," Appl. Phys. Lett. 66 (25), Jun. 19, 1995, pp. 3495–3497.

S. V. Hattangady et al., "Ultrathin nitrogen–profile engineered gate dielectric films," IEDM Tech. Digest,1996, pp. 495–498.

T. Devoivre et al., "A Reliable 0.1 $\mu$m $Ta_2O_5$ Transistor Manufactured with an Almost Standard CMOS Process," Symposium on VLSI Technology, 10A–1 (1999).

A. Chatterjee et al., "CMOS Metal Replacement Gate Transistors using Tantalum Pentoxide Gate Insulator," IEDM Tech. Digest, (1998), pp. 777–780.

D. Park et al., "SiON/Ta2O5/TiN Gate–Stack Transistor with 1.8nm Equivalent SiO2 Thickness," IEDM Tech. Digest, 1998, pp. 381–384.

I.C. Kizilyalli et al., "Stacked Gate Dielectrics with TaO for Future CMOS Technologies," 1998 Symp. VLSI Tech., p. 216–217.

H. Shimada et al., "Current Drive Enhancement by Using High–Permittivity Gate Insulator in SOI MOSFET's and its Limitation," IEEE Transactions on Electron Devices, vol. 43, No. 3, Mar. 1996, pp. 431–435.

T. Dervoivre et al., "On the Integration of Ta2O5 as a Gate Dielectric in sub–0.18$\mu$m CMOS Processes," IEEE/SEMI Advanced Semiconductor Manufacturing Conf., pp. 434–438.

C. Hobbs et al., "Sub–Quarter Micron CMOS Process for TiN–Gate MOSFETs with TiO2 Gate Dielectric formed by Titanium Oxidation," Symposium on VLSI Technology, 10A–2 (1999).

B. He et al., "A 1.1 nm Oxide Equivalent Gate Insulator Formed Using TiO2 on Nitrided Silicon," IEDM., p. 1038.

A. Kalnitsky et al., "TiSi2 Integration in a Submicron CMOS Process," J. Electrochem. Soc., vol. 142, No. 6, Jun. 1995, pp. 1992–1996.

A. Chin et al., "Device and Reliability of High–K $Al_2O_3$ Gate Dielectric with Good Mobility and Low $D_{it}$," Symposium on VLSI Tech. 10–A–3 (1999).

S. C. Song et al., "Ultra Thin High Quality Stack Nitride/ Oxide Gate Dielectrics Prepared by in–situ Rapid Thermal $N_2O$ Oxidation of NH3–nitrided Si," Symposium on VLSI Tech., 10–A–4 (1999).

S. C. Song et al., "Ultra thin (<20Å) CVD $Si_3N_4$ Gate Dielectric for Deep–Sub–Micron CMOS Devices," IEDM Tech. Digest, pp. 373–374.

X. Guo et al., "High Quality Ultra–thin TiO2/Si3N4 Gate Dielectric for Giga Scale MOS Technology," IEDM Tech. Digest, pp. 377–378.

R. Singh et al., "Role of Rapid Photothermal Processing in Process Integration," IEEE Transactions on Electron Devices, vol. 45, No. 3, Mar. 1998, pp. 643–654.

R. Singh et al., "High and Low Dielectric Constant Materials," The Electrochemical Society, vol. 8, Summer 1999, pp. 26–30.

E. L. Wolf, "Principles of Electron Tunneling Spectroscopy," Oxford University Press, New York, Oxford (1989).

* cited by examiner

MOS-TYPE SEMICONDUCTOR DEVICE AND METHOD FOR MAKING SAME

This application claims priority under 35 USC §119(e)(1) of provisional application No. 60/173,244 filed Dec. 28, 1999.

TECHNICAL FIELD OF THE INVENTION

This invention relates generally to the field of electronic devices, and more particularly to an improvement in MOS-type semiconductor devices and a method for making the same.

BACKGROUND OF THE INVENTION

A Metal-Oxide-Semiconductor Field-Effect-Transistor ("MOSFET") is a four-terminal electronic semiconductor device and consists of: (1) a p- (or n) type semiconductor substrate into which two n+ (or p+) regions, the source and the drain, are formed; and (2) a metal contact called a gate formed on top of a gate oxide. In integrated circuits ("ICs"), MOSFETS serve as switches. That is, they may switch current within the IC from the source into the drain "on" or "off" according to the potential difference between the gate and the substrate. The function played by the gate oxide is that of a dielectric layer in order to induce an inversion layer or a channel between the source and the drain, and an insulating layer that insulates the gate from the semiconductor.

It has been deemed desirable within ICs to scale-down, or miniaturize, the physical size of the IC. This may require, inter alia, scaling down of MOSFETS and other IC components, including scaling-down of the thickness of vertical layers out of which such components are formed. But in the case of gate oxide of a MOSFET, when the thickness of a gate oxide layer is reduced beyond a certain level (for instance, below the level of 2 or 3 nanometer (nm)), it has been found that certain difficulties may ensue. Specifically, the quantum electronic event known as electron tunneling (or leakage) may cause a current to pass through such very thin gate oxide layers at undesired times, thus possibly causing three serious problems: (1) an increase of the power consumption of the IC because of current flows in MOSFET even when the MOSFET is intended to be in its "off" state; (2) a decrease in the IC's operating speed because of unintended current flow; and (3) accelerated buildup of gate oxide defects as a result of higher-than-intended current density through the gate, resulting in premature dielectric breakdown of the oxide and thus of the IC.

Most of the previous attempts at solving the problem of tunneling-induced leakage through the gate oxide of a MOSFET concentrated upon increasing the dielectric constant of the gate insulating layer, i.e., obtaining the same desired charge storage capability with the use of a thicker dielectric film of increased dielectric constant, and hence reducing the tunneling current flowing through the gate.

In such prior art attempts to reduce tunneling current, three general methods for increasing the dielectric constant may be mentioned. First, incorporation of nitrogen into the $SiO_2$ film forming the gate oxide. Secondly, nitridation of the $SiO_2$ film. Thirdly, replacing the $SiO_2$ film with a completely different gate oxide material having a higher dielectric constant than that of $SiO_2$. Materials having such higher dielectric constants may include $Si_3N_4$, $TiO_2$, $Ta_2O_5$, and $Al_2O_3$.

In a crystal, the atoms that construct the crystal are positioned in such fashion that the atoms have periodicity along certain dimensional orientations. One can consider three basic vectors $a_1$, $a_2$, and $a_3$ as representing the three dimensions or axes within a crystal, and hence may use such vectors in describing the periodic regulation of atom positioning. These basic vectors may be referred to as primitive translation vectors. When one wishes to specify a particular orientation in a crystal, he can use the three primitive translation vectors and represent the particular orientation using a designation such as [xyz], (wherein x, y, and z are all integers), in which case the orientation is parallel to the vector $xa_1+ya_2+za_3$. Next, let us consider an origin point at a certain atom within a crystal. It is possible to consider a plane that crosses three atoms whose positions are represented by three vectors, $pa_1$, $qa_2$, and $ra_3$, respectively, from the origin point. In this case, we represent the plane in question by using the designation, (xyz), (wherein x, y and z are all integers). Here, the integers, x, y, and z, are chosen to make the absolute values of the integers as small as possible, and to make the ratio between x, y, and z to be the same as the ratio between 1/p, 1/q, and 1/r. We may use the designation, (xyz), for all the planes parallel to the plane thus considered.

Each of the above-described prior art approaches to reducing leakage current by increasing dielectric constant of the gate oxide may have some utility for reduction of tunneling and leakage current. However, in all of the above-described prior art methods for reducing leakage current, the crystalline orientation of the gate electrode has generally not been taken into account as another possible parameter whose variation could be employed for further reducing the leakage current.

SUMMARY OF THE INVENTION

Accordingly, a need has arisen in the art for an improved MOS-type semiconductor device, in which the MOSFET has a gate oxide providing further-reduced current leakage/tunneling by virtue of judicious utilization of the crystallographic orientation (and/or other physical parameters that influence semiconducting properties) of the gate oxide layer. The present invention provides such a MOSFET and a method for making it that may substantially improve the leakage current properties of the MOSFET and hence the performance of an IC.

In accordance with the present invention, a MOSFET comprises a first semiconductor adjacent an insulating film, in turn adjacent a second semiconductor, wherein the first semiconductor and the second semiconductor are monocrystalline semiconductors and wherein the crystalline axes of the first and second semiconductors are arranged in different directions to each other. More specifically, the MOSFET of the present invention may be formed by selecting a first semiconductor whose [100] crystallographic direction is orthogonal with respect to the surface of the insulating film, and a second semiconductor whose [111] crystallographic direction is orthogonal with respect to the surface of the insulating film.

The technical advantages of the present invention include the provision of enhanced leakage current reduction within a MOSFET by appropriate selection not only of a gate insulator having high dielectric constant, but also of appropriate semiconductors on either side of the gate insulator layer so that tunneling current is also dependent upon (and reduced by) the crystallographic orientation of the gate electrode and the substrates.

Another technical advantage of the present invention is that it provides a number of possible particular combinations of constituent semiconductors for a MOSFET, wherein the semiconductors are chosen for advantageous crystallographic orientations (and/or other physical parameters that influence semiconducting properties) and leakage reduction. A further advantage of the present invention is that it provides fabrication methods for formation of MOSFETS wherein each of the semiconductors is assembled in proper crystallographic orientation with respect to the insulating oxide layer.

Other technical advantages of the present invention will be readily apparent to those skilled in the art from the following drawings, descriptions, and claims.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein.

DETAILED DESCRIPTION OF THE INVENTION

The present invention is best understood with reference to the drawings, which may be used for understanding (a) the generic configuration of any MOSFET structure (including both those of the prior art and those of the present invention); (b) the specific MOSFET structure of the present invention; and (c) a method for forming the MOSFET of the present invention.

Figure 1:
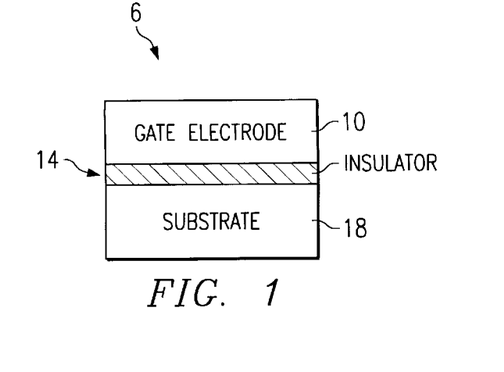
FIG. 1 illustrates a schematic cross-sectional view of a generic MOS structure within a field-effect-transistor.

FIG. 1 illustrates a schematic cross-sectional view of a generic MOS structure within a field-effect-transistor 6. Gate electrode 10 comprises a first semiconductor. This may be a semiconductor of any appropriate chosen type, for instance, silicon. Insulator 14 comprises a gate insulator. This may be a substantially non-conductive material of desired variety, such as, for instance, silicon dioxide. Substrate 18 comprises a second semiconductor. This again may be a semiconductor of desired type.

Figure 2:
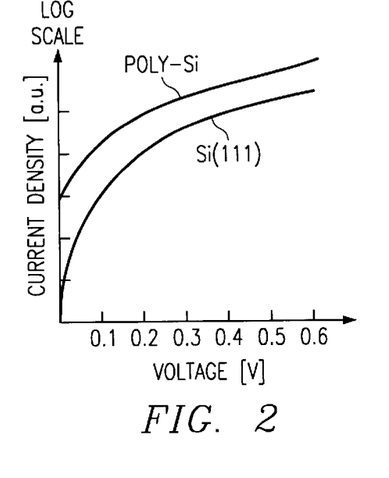
FIG. 2 illustrates exemplary voltage dependences for tunneling currents through insulator film based upon gate electrodes having different crystallographic orientations.

FIG. 2 illustrates exemplary voltage dependences for tunneling currents through an insulator film based upon gate electrodes having different crystallographic orientations.

In accordance with the present invention, it is determined that the crystallographic orientation of the gate electrode may influence the tunneling current density through the insulator film. FIG. 2 illustrates how this current density (as a function of applied voltage) may vary depending upon the chosen gate electrode semiconductor. In FIG. 2, the horizontal axis represents the applied voltage and the vertical axis represents the logarithmic current density. Curves are shown for the case in which the gate electrode comprises (a) monocrystal silicon having Si(111) crystallographic orientation (the lower curve) and (b) polycrystalline silicon (the upper curve).

(The difference between monocrystal silicon and polycrystalline ("polysilicon" or "poly-Si") may be understood as follows: Consider a bulk crystal that has a finite volume. When the bulk crystal maintains a periodicity of atomic spacing throughout its volume, the crystal may be referred to as a monocrystal. On the other hand, when the bulk crystal dose not maintain such periodicity throughout its volume, and consists of many small pieces of single crystals with different orientations, the crystal may be referred to as a poly-crystal).

In connection with FIG. 2, it can be observed that considerable variation of current density may result depending upon the crystalline orientation of the gate electrode. In the specific example of FIG. 2, the lower curve reflects a lower tunneling current density for orientated monocrystal Si(111) gate electrode. The polysilicon gate electrode (whose higher tunneling current density is shown in the upper curve of FIG. 2) has no single crystallographic orientation (that is, it comprises many grains of Noncrystalline silicon in an aggregate, the crystallographic orientations of such individual monocrystal grains being randomly oriented with respect to those of other monocrystal grains, such that the polysilicon aggregate as a whole has no single crystallographic orientation).

Figure 3:
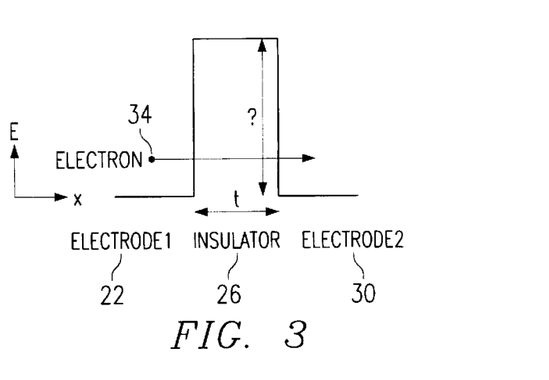
FIG. 3 illustrates a generic schematic view of an energy barrier inserted between two electrodes.

FIG. 3 illustrates a generic schematic view of an energy barrier inserted between two electrodes.

In FIG. 3, wherein the horizontal axis denotes translational distance and the vertical axis denotes a voltage potential, a first semiconductor electrode (indicated generally at 22) is positioned directly adjacent insulator 26, which in turn is positioned, on its other side, directly adjacent a second semiconductor electrode 30. Electron 34 is shown as impinging upon insulator 26, which has potential Φ. In connection with FIG. 3, the first semiconductor electrode 22 may be viewed as either the substrate electrode or the gate electrode of a MOSFET, and likewise the second semiconductor electrode 30 may be viewed as, respectively, either the gate electrode or the substrate electrode of the MOSFET.

Figure 4:
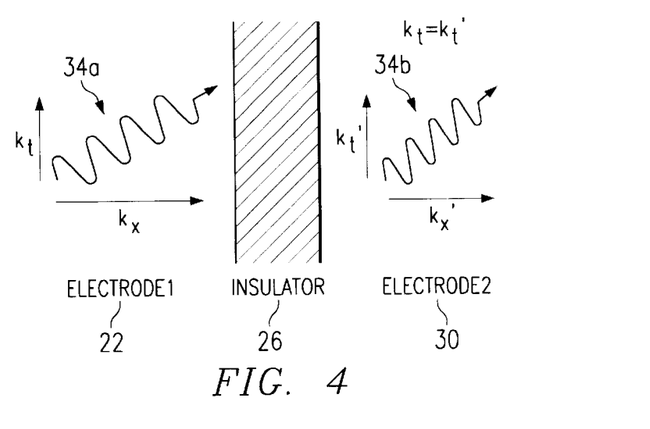
FIG. 4 illustrates a cross-sectional view of a generic structure comprising a first electrode adjacent an insulator film adjacent a second electrode, wherein an electron is illustrated (in wave form) as impinging upon (and subsequently being emitted on the opposite side of) the insulator film.

FIG. 4 illustrates a cross-sectional view of a generic structure comprising a first semiconductor electrode 22 adjacent an insulator 26 adjacent a second semiconductor electrode 30, wherein an electron (34a, 34b) is illustrated (in wave form) as impinging upon (and subsequently being emitted on the opposite side of) the insulator film.

In FIG. 4, the electron is depicted as both an incident electron wave 34a and an emitted electron wave 34b. The incident electron wave 34a represents the electron as it is travelling through first semiconductor electrode 22 and impinging upon insulator 26, and emitted electron wave 34b represents the electron as it is being emitted from the opposite side of insulator 26 and travelling from there through second semiconductor electrode 30.

Incident electron wave 34a and emitted electron wave 34b are illustrated as resolved into their component wave number vectors $k_x$ and $k_x'$ (the wave number vector components parallel to the direction of travel of electron 34) and $k_t$ and $k_t'$ (the wave number vector components orthogonal to the plane of the interfaces between the insulator 26 and the first semiconductor electrode 22 and second semiconductor electrode 30).

The wave number vector is used to represent an electron as a wave. It is proportional to the crystallographic momentum of the electron. Wave number vectors define a wave number vector space ("k-space"). That is, when considering the properties of an electron, we can treat electrons in a crystal by their wave number vectors rather than by their positions within the crystal. The space consisting of these wave number vectors is wave number vector space (k-space).

In connection with FIG. 4, it will be observed that the wave number vector component parallel to the plane of the interface between insulator 26 and first and second semiconductor electrodes 22 and 30 is the same in both incident electron wave 34a and emitted electron wave 34b. That is, $k_t = k_t'$.

Figure 5:
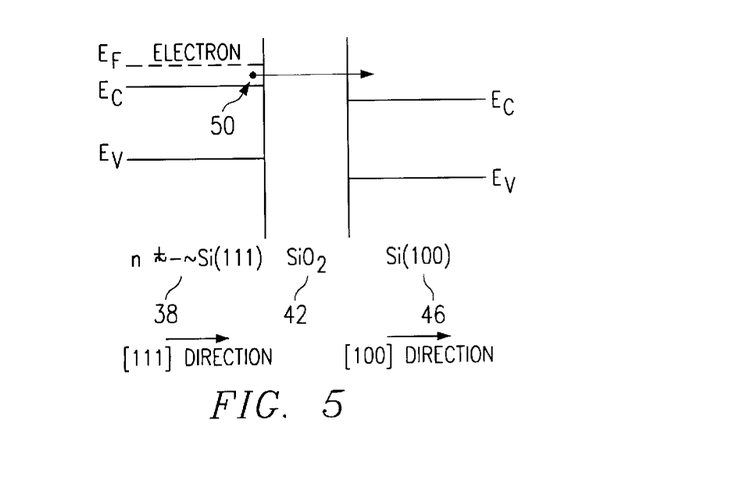
FIG. 5 illustrates a generic schematic of the energy-band of a MOS structure of the type having crystallographic orientations Si(100)—SiO$_2$—Si(111).

FIG. 5 illustrates a generic schematic of the energy-band of a MOS structure of the type having crystallographic orientations Si(111)—SiO$_2$—Si(100).

In FIG. 5, a first semiconductor electrode (indicated generally at 38) comprises n$^+$-doped monocrystal silicon of the [111] crystallographic orientation (n$^+$-Si(111) and is positioned directly adjacent one side of an SiO$_2$ insulating layer 42. Positioned directly adjacent the opposite side of insulating layer 42 is a second semiconductor electrode (indicated generally at 46) comprising undoped monocrystal silicon of the [100] crystallographic orientation.

Electron 50 is depicted as approaching insulating layer 42 through first semiconductor electrode 38. The designations $E_F$, $E_C$, and $E_V$ represent, respectively: the energy levels of Fermi energy (a critical energy threshold; most of the states whose potential is lower than the $E_F$ will be occupied by electrons, whereas most of the states whose potential is higher than the $E_F$ level will not be occupied by electrons); the energy level ($E_C$) of the conduction band; and the energy level ($E_V$) of the valence band.

Figure 6:
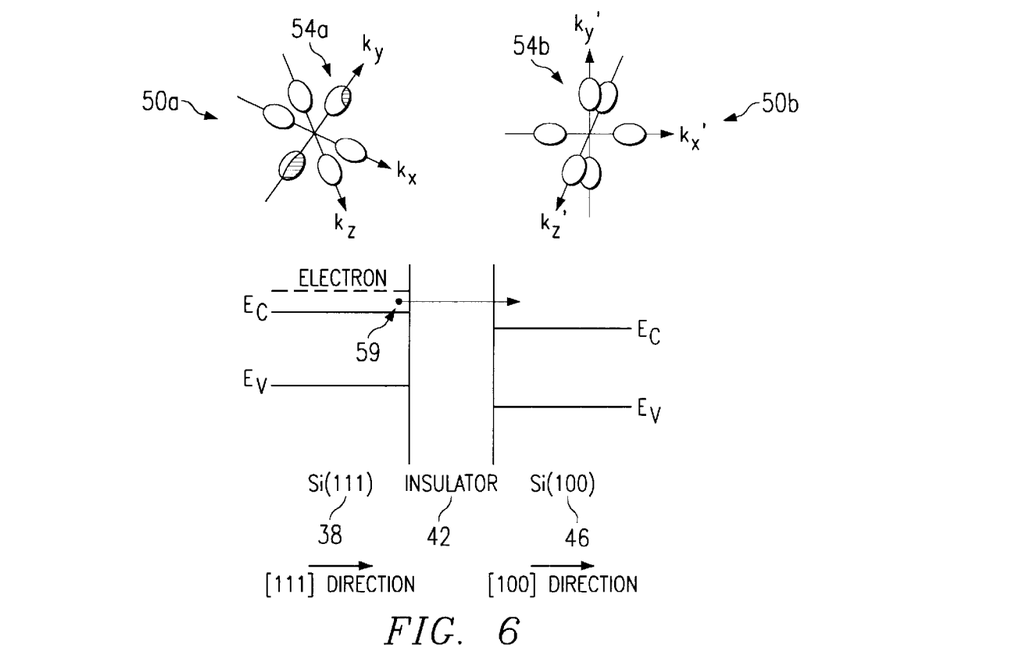
FIG. 6 illustrates a schematic cross-sectional view in connection with a generic electron-tunneling scenario from an Si(111) gate electrode to an Si(100) substrate through an insulating layer.

FIG. 6 illustrates a schematic cross-sectional view in connection with a generic electron tunneling scenario when the first semiconductor electrode 38 described above in connection with FIG. 5 is a gate electrode in a MOSFET and the second semiconductor electrode 46 described above in connection with FIG. 5 is a substrate electrode in a MOSFET, and electron 50 is impingement upon insulator 42.

As a general characteristic of semiconductors, there exist valence bands and conduction bands within the semiconductor material. In the valence bands, holes (that is, vacancies of electrons), can move. In the conduction bands, electrons can move.

The states in k-space for electrons existing in the conduction band are known as "carrier pockets."

In connection with FIG. 6, electron 50 is represented, on the respective electron-impinging and electron-emitting sides of insulator 42, by vectorized incident electron 50a and vectorized emitted electron 50b (wherein the vectorized representations of incident and emitted electron 50a and 50b are vectorized representations in k space).

The ellipsoid spheres 54a and 54b represent the respective carrier pockets (in the bottom of the Si conduction bands) for the respective incident and emitted electrons 50a and 50b in the respective first (gate) semiconductor electrode 38 and second (substrate) semiconductor electrode 46.

With reference to incident electron 50a, only those electrons 50a whose specific wave vector component along a given axis lies within the shaded portion of the carrier pocket 54a for that wave vector component axis can contribute to the tunneling (or leakage) process. The specific wave vector components for incident electrons 50a, and the specific shaded portions of carrier pocket 54a corresponding to each such wave vector component, depend, inter alia, upon the crystallographic orientation of the first semiconductor electrode 38 with respect to insulator 42.

Figure 7:
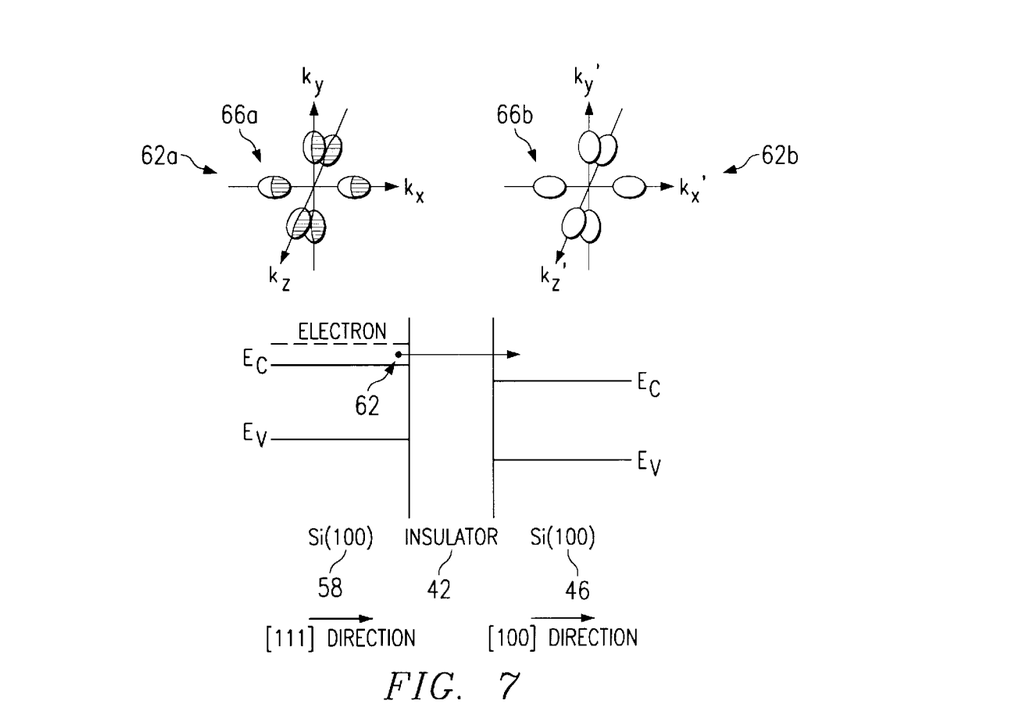
FIG. 7 illustrates a schematic cross-sectional view in connection with a generic electron-tunneling scenario from an Si(100) gate electrode to an Si(100) substrate through an insulating layer.

FIG. 7 illustrates a schematic cross-sectional view in connection with a generic electron tunneling scenario when (in contrast to the situation described in connection with FIG. 6), a first semiconductor electrode 58 is a gate electrode comprising not monocrystal Si(111) but rather monocrystal Si(100) in a MOSFET and the second semiconductor electrode 46 is, as in FIG. 6, a substrate electrode comprising Si(100) in a MOSFET, and electron 62 is impingement upon insulator 42. That is, the configurations of FIGS. 6 and 7 are analogous except that in FIG. 6 the first semiconductor electrode 38 and the second semiconductor electrode 46 (corresponding respectively to the gate electrode and substrate electrode) are of disparate crystallographic orientation, whereas in FIG. 7 the first semiconductor 58 and the second semiconductor electrode 46 are of identical type and crystallographic orientation.

In connection with FIG. 7, electron 62 is represented, on the respective electron-impinging and electron-emitting sides of insulator 42, by vectorized incident electron 62a and vectorized emitted electron 62b (wherein the vectorized representations of incident and emitted electron 62a and 62b are vectorized representations in k space). The ellipsoid spheres 66a and 66b represent the respective carrier pockets (in the bottom of the Si conduction bands) for the respective incident and emitted electrons 66a and 66b in the respective first (gate) semiconductor electrode 58 and second (substrate) semiconductor electrode 46 of FIG. 7.

Just as mentioned in connection with FIG. 6, only those electrons 62a whose specific wave vector component along a given axis lies within the shaded portion of the carrier pocket 66a for that wave vector component axis can contribute to the tunneling (or leakage) process in FIG. 7. It will be noted that the shaded portions of carrier packets 66a in FIG. 7 have a total volume substantially greater than the volume represented by the shaded portions of carrier packets 54a of FIG. 6. This greater volume of shaded carrier packets denotes the fact that a greater amount of electron tunneling (and hence a greater leakage current) can occur in the MOSFET of FIG. 7 than in the MOSFET of FIG. 6. This is so because, although all other properties of the respective MOSFETS of FIGS. 6 and 7 may be assumed to be substantially identical, the crystallographic orientations of first semiconductor electrodes 38 and 58, respectively, differ. It is thus found that choosing a first semiconductor electrode of crystallographic orientation different from that of the second semiconductor electrode 46 is more effective for preventing leakage current than choosing a first semiconductor electrode of the same crystallographic orientation as that of the second semiconductor electrode 46.

In connection with FIGS. 6 and 7, the diminution of electron current leakage that is obtained by employing the structure of FIG. 6 rather than the structure of FIG. 7 may be explained as follows. The energy and the parallel momentum (with respect to the interface with insulator 42) of an electron 50 or 62 must be conserved in the process of tunneling through the insulator 42 (which may be viewed as an energy barrier). The energy barrier of insulator 42 is the difference between the highest energy level that can be occupied in the first semiconductor electrode 38 or 58 and the conduction band level of the insulator 42. The density of states in the first semiconductor electrode 38 or 58 in which an electron can tunnel through the insulator 42 and into the second semiconductor electrode 46 can be confined if the crystal axes of the respective first and second semiconductors are arranged so as to minimize the overlap between the carrier pocket of the first semiconductor electrode (38 or 58) and the carrier pocket of the second semiconductor electrode 46 (as projected to the momentum space of the first semiconductor electrode 38 or 58). In such a configuration (as shown in FIG. 6), the density of states in the second semiconductor electrode 46 in which an electron can tunnel "back" through the insulator 42 into the first semiconductor electrode 38 is also confined. Thus, the leakage current between the first and second semiconductor electrodes (in either direction) can be reduced visávis the case, for example, in which the carrier pockets of the first and second semiconductors electrode (e.g., 66a and 66b) exactly overlap in momentum space, as in the scenario depicted in connection with FIG. 7, wherein the first semiconductor electrode 58 is of crystallographic orientation (with respect to insulator 42) identical to that of second semiconductor electrode 46.

Figure 8:
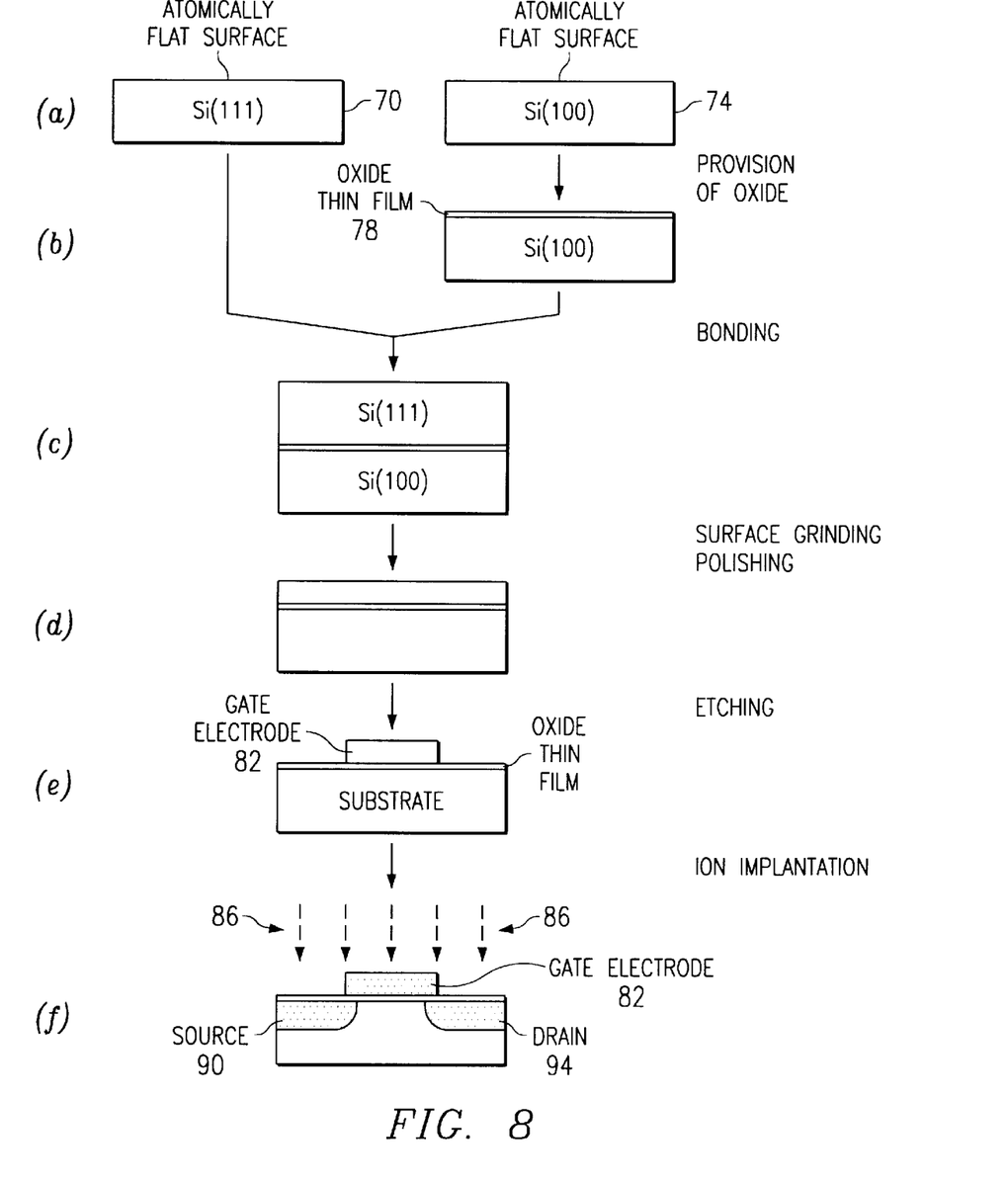
FIG. 8 illustrates a flow chart or schematic process diagram for a method of fabricating a MOSFET wherein the gate electrode and substrate are semiconductors of different crystallographic orientation.

FIG. 8 illustrates a flow chart or schematic process diagram for a method of fabricating a MOSFET wherein the gate electrode and substrate are semiconductors of different crystallographic orientation.

The method illustrated in connection with FIG. 8 is an application of wafer bonding technology known and used generally in connection with Silicon On Insulator (SOI) materials. It is illustrated in connection with an exemplary case in which it is desired to form a gate electrode out of a quantity of monocrystal silicon of [111] orientation upon a substrate of monocrystal silicon of [100] orientation, the gate electrode and the substrate electrode being separated by oxide thin film, but the process is more generally applicable to gate electrodes and substrates of other chosen materials and other particular crystallographic orientations, so long as the crystallographic orientations of the gate electrode and substrate electrode are different one from the other.

In connection with FIG. 8, gate electrode piece 70 comprises a quantity of monocrystal Si(111) and substrate electrode piece 74 comprises a quantity of monocrystal Si(111). In step (a) of the process illustrated in FIG. 8, gate electrode piece 70 and substrate electrode piece 74 are prepared so that at least one contacting surface is atomically flat. It is possible to create an atomically-flat surface upon gate electrode piece 70 by treating it in an $NH_4F$ solution, and to create an atomically flat surface upon substrate electrode piece 74 by annealing it in an $H_2$ atmosphere.

In step (b), an oxide thin film (as, for instance, a thin film of $SiO_2$) is formed upon the atomically-flat surface of substrate electrode piece 74 by (a) conventional thin film deposition techniques or (b) thermal oxidation processing performed upon the material of the substrate itself.

In step (c), the atomically-flat surface of the gate electrode piece 70 is bonded to the oxide thin film 78 formed on top of the atomically flat surface of substrate electrode piece 74. The bond between gate electrode piece 70 and the thin oxide film 78 (and hence the substrate electrode piece 74) may be completed by annealing the bonded pieces in high ambient temperature. Thus, the crystallographic orientation of gate electrode piece 70 with respect to oxide thin film 78 is orthogonal when compared to the crystallographic orientation of substrate electrode piece 74 with respect to the opposite side of oxide thin film 78.

In step (d), gate electrode piece 70 is ground and polished (on the side opposite the side previously bonded to oxide thin film 78) so as to reduce the thickness of gate electrode piece 70 to the required thickness for formation of a gate electrode as required within the particular MOSFET and IC.

In step (e), gate electrode piece 70 is etched (using known techniques for photolithographic etching within semiconductors) to form gate electrode 82.

In step (f), the conductivity of certain regions of the aggregate gate electrode—substrate electrode piece is altered by known processes (e.g., ion implantation) in order to dope the gate electrode 82 and portions of the substrate electrode piece 74 with dopant (indicated generally at 86) of chosen conductive properties to form doped gate electrode 82, as well as source region 90 and drain region 94 within substrate electrode piece 74. Following this doping step, the entire assembly (gate electrode 86 bonded to oxide thin film 78 bonded to substrate electrode piece 74) is annealed for activation.

Figure 9:
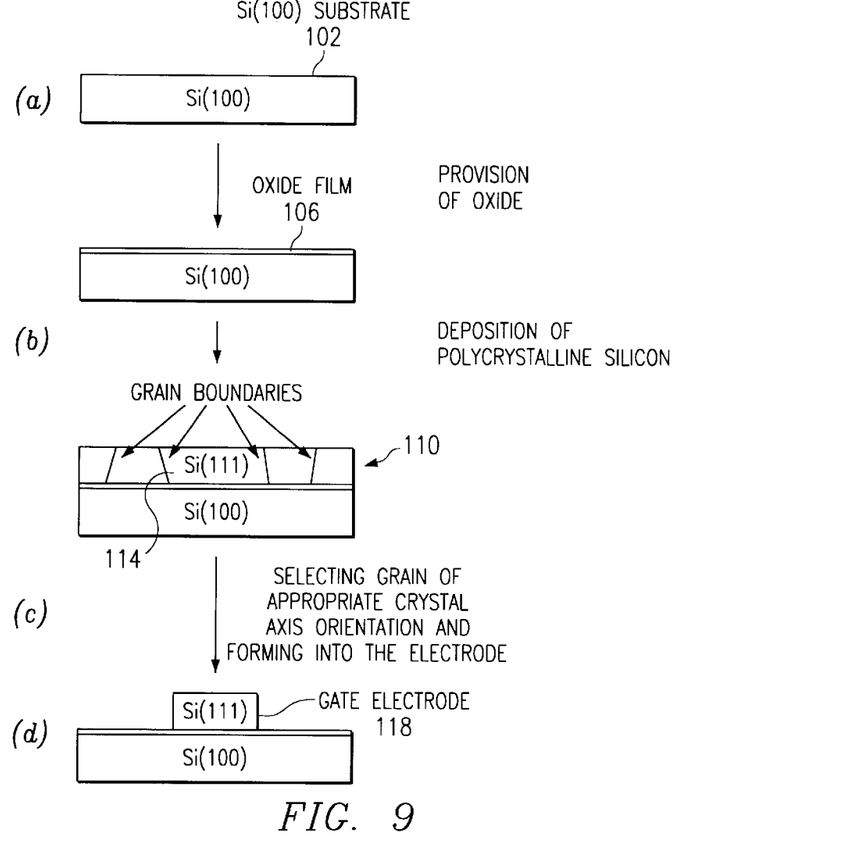
FIG. 9 illustrates a flow chart or schematic process diagram for a further method of fabricating a MOSFET wherein the gate electrode is formed out of a deposited polycrystalline layer.

FIG. 9 illustrates an exemplary flow chart or schematic process diagram for a further method of fabricating a MOSFET wherein the gate electrode is formed out of a deposited polycrystalline layer. In step (a), monocrystal Si(100) semiconductor substrate 102 is provided, having a relatively flat upper surface.

In step (b), oxide film 106 is provided on the upper surface of the semiconductor substrate 102. (Oxide film 106 may be provided by, for example, thin layer deposition processes known in the art or by thermal oxidation processing of the substrate itself).

In step (c), a polycrystalline silicon layer 110 is deposited on top of oxide film 106. Polycrystalline silicon layer 110 contains an aggregate of individual monocrystal silicon crystal grains, each having a distinct crystallographic orientation, and each separated by a grain boundary. For example, monocrystal grain 114 is a monocrystal Si(111) crystal within the polycrystalline silicon layer 110.

In step (d), one of the particular monocrystal grains is identified and selected for use—in this example, it could be selected only if (for instance) monocrystal grain 114 were determined to be a Si(111) grain having [111] plane parallel to the surface of substrate 102. Once such particular monocrystal grain is identified and selected, the other grains in polycrystalline silicon layer 110 are removed, and monocrystal grain 114 is shaped, by etching or other processes, in order to form monocrystal grain 114 into gate electrode 118. Doping can then be performed for formation of the necessary conductivity paths for the MOSFET. Because gate electrode 118 consists of monocrystal silicon with crystallographic orientation orthogonal to that of monocrystal substrate 102, the fabrication method just described in conjunction with FIG. 9 provides an additional alternative, employing polycrystalline silicon as one building block, for forming a MOSFET achieving the advantages of the present invention.

Further to the discussion set forth regarding FIGS. 3–9, and to the general advantages provided by the present invention and its use (and method for forming) of gate electrodes and substrate electrodes having crystallographic orientations (as evaluated with reference to the insulator layer separating the electrodes) that differ one from the other, a brief discussion of the likely bases for, and extent of, these advantages, follows herewith.

The gate-voltage vs. channel-current behavior of MOSFETs is affected by the selection of crystallographic planes of substrate, because the speed of carriers (electrons and/or holes) travelling through channel region is dictated in part or whole by the carrier mobility (the ability of electron and/or hole to move in silicon crystal). For most silicon MOS transistors, silicon substrates (wafers) whose surfaces are parallel to Si(100) planes have in the past been used because the carrier mobility along the Si(100) plane is large compared to other crystallographic planes.

The additional leakage current reduction gained by applying the present invention to MOS-type structures may be theoretically calculated to show how the leakage current between gate electrode and substrate can be reduced when the crystallographic axes of gate electrode and substrate are arranged in directions different to each other.

Let us consider a process in which an electron 34, having a certain energy, tunnels through a barrier (e.g., insulator 26 shown in FIG. 4), whose potential $\Phi$ is higher than the energy of the electron, and travels from a first semiconductor electrode 22 to a second semiconductor electrode 30. As shown in FIG. 4, the physics of the movement of the electron can be separated into two different components, one a component parallel to the x-axis, and the other a component orthogonal to the x-axis.

The momentum component $k_t$, whose direction is orthogonal to the x-axis, does not change if and when electron 34 tunnels through insulator 26. The probability, T, of an electron 34 tunneling through the potential barrier (i.e., insulator 26) is decided by the energy of electron 34, the barrier height, $\Phi$, and the barrier thickness, t. The probability, T, is a function of geometry of the device.

The current density J caused by electrons 34 tunneling through the insulator 26 from the first semiconductor electrode 22 to the second semiconductor electrode 30 is expressed by the following equation:

$$J \iint \int d^2 k_t dk_x \cdot v_x \cdot T \cdot f_1(E) \cdot D_2(E) \cdot [1-f_2(E)] \quad \text{EQUATION 1}$$

in which $K_x$ is 1D wave vector parallel to the tunneling direction, $K_t$ is 2D wave vector in a plane perpendicular to the tunneling direction, $v_x$ is the velocity of electron 34 along the x-axis in the first semiconductor electrode 22, E is the energy of electron 34 decided by the magnitudes of $k_t$ and $k_x$, $f_1(E)$ is the probability that a state having the energy, E, will be occupied by an electron in the first semiconductor electrode 22, $D_2(E)$ is the density of state having the energy, E, in the second semiconductor electrode 30, and $[1-f_2(E)]$ is the probability that a state having the energy, E, will not be occupied by any electron.

The integral of EQUATION 1 is done in the momentum space, $(k_x, k_t)$, of first semiconductor electrode 22. Considering the aforementioned principle of the momentum conservation of $k_t$ as between its pre-tunneling and post-tunneling states, the integral in EQUATION 1 becomes very small in the case when the crystallographic axes of first semiconductor electrode 22 and second semiconductor electrode 30 are arranged in directions different (with respect to the plane of the electrodes' respective interfaces with insulator 26) to each other.

Having described the basic configuration of the MOSFETs of the present invention, having given exemplary descriptions of specific gate electrodes and substrate electrodes that might be chosen, and having described a method for fabricating such MOSFETS, certain further examples may be given of advantageous combinations of gate electrodes, insulators, and substrate electrodes in accordance with the present invention. Examples of such additional combinations include (but are not limited to):

(a) MOSFETs comprising an Si(111) substrate and a single-crystal silicon gate electrode (plus a conventional insulator layer separating substrate and gate electrode), in which the [100] direction of the gate electrode is orthogonal to the substrate surface;

(b) MOSFETs comprising Si(100) substrate and a single-crystal silicon gate electrode, in which the [111] direction of the gate electrode is orthogonal to the substrate surface, and the gate electrode is grown on top of an arsenic insulating layer on top of the silicon substrate;

(c) MOSFETs comprising an Si(100) substrate and a single-crystal silicon gate electrode, in which the [111] direction of the gate electrode is vertical to the substrate surface, and the gate electrode is grown on top of a tantalum oxide insulating layer on top of the silicon substrate;

(d) MOSFETs comprising a Si(100) substrate and a single-crystal germanium gate electrode in which the [100] direction of the gate electrode is orthogonal to the substrate surface and a conventional oxide insulator is employed to separate the electrodes; and (e) MOSFETs comprising Ge(100) substrate and a single-crystal silicon gate electrode in which the [100] direction of the gate electrode is vertical to the substrate surface and a conventional oxide insulator is employed to separate the electrodes.

While most of the above examples of embodiments of the present invention illustrate it in connection with the advantageous situating of a substrate semiconductor and a gate electrode semiconductor with a crystallographic orientation orthogonal to that of the substrate (with both gate and substrate semiconductors in most cases comprising monocrystal silicon), this invention also includes embodiments in which the gate electrode semiconductor and substrate semiconductor have the identical monocrystal crystallographic orientation (with respect to the oxide insulating layer), so long as the gate electrode semiconductor and the substrate semiconductor are otherwise sufficiently different types of semiconductor to achieve the benefits of this invention. That is, even if gate and substrate share the same crystallographic orientation, they may still have sufficiently different semiconductor properties (which are still related, in part, to the specific crystallographic properties of the respective semiconductors) that leakage is reduced.

Figure 10:
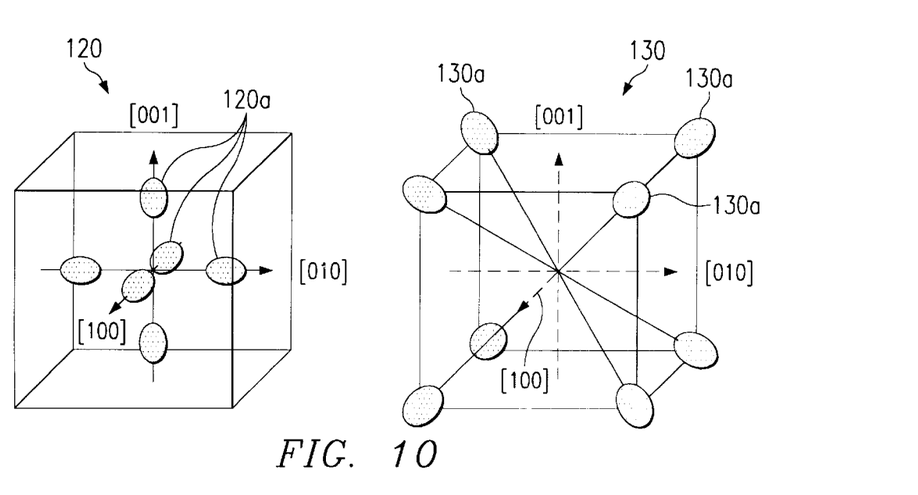
FIG. 10 provides a conceptual illustration of the respective carrier pockets of monocrystal silicon and monocrystal germanium in connection with an embodiment of the present invention in which monocrystal semiconductors of identical crystallographic orientation may be used to achieve reduced current leakage.

FIG. 10 provides a conceptual illustration of the respective carrier pockets of monocrystal silicon and monocrystal germanium in connection with an embodiment of the present invention in which monocrystal semiconductors of identical crystallographic orientation may be used to achieve reduced current leakage. Indicated generally is silicon crystal 120. It has carrier pockets 120a. Also indicated generally is germanium crystal 130. It has carrier pockets 130a. Although both silicon crystal 120 and germanium crystal 130 are monocrystal, and both share homologous crystallographic axes, a reduced-leakage MOSFET might still be formed from a substrate comprising such monocrystal silicon and a gate electrode comprising such monocrystal germanium (or vice versa) even if the two semiconductors were 20 joined with non-opposed crystallographic orientations. This is so because, as shown in FIG. 10, the shapes and positions of the carrier pockets (120a, 130a) of the respective substrate and gate electrode semiconductors (120, 130a) are completely different and thus the likelihood of leakage is reduced, similar to in the earlier-described embodiments in which carrier pockets are made not to overlap by providing opposed crystallographic orientations for substrate and gate electrode.

Thus, because germanium monocrystals are different from silicon monocrystals (whereas two different silicon monocrystals share more properties in common), the exemplary silicon:germanium MOSFET could provide reduced leakage even though the substrate and gate semiconductors have non-opposed crystallographic directions, whereas a silicon:silicon arrangement of substrate and gate with non-opposed crystallographic directions would not reduce leakage in such fashion, given the high degree of overlap in substrate and gate electrode carrier pockets. Carrier pocket shape and position are influenced in part by crystallographic structure and other semiconductor properties. Accordingly, it is seen that providing orthogonal crystallographic orientation in gate electrodes and substrate is not the only way to reduce leakage in accordance with this invention; rather, any combination and situating of gate electrode semiconductor and substrate semiconductor in which the two semiconductors have sufficiently-different semiconductor properties (as influenced by crystallographic structure, etc.) may potentially provide reduced leakage.

Although the present invention has been described herein in detail, it should be understood that various changes, substitutions, and alterations could be made hereto without departing from the spirit and scope of the present invention as defined by the appended claims.

What is claimed is:

1. An MOS-type semiconductor device comprising a first semiconductor, an insulator adjacent said first semiconductor, and a second semiconductor, wherein said first and second semiconductors are monocrystalline semiconductors having crystallographic axes and wherein the crystallographic axes of said first and second semiconductors are arranged in directions different to each other; wherein the [100] crystallographic orientation of said first semiconductor is orthogonal to a plane defined by the junction between said first semiconductor and said insulator and the [111] crystallographic orientation of said second semiconductor is orthogonal to the same plane.

2. The MOS-type semiconductor device of claim 1, wherein said first and second semiconductors comprise silicon electrodes.

3. The MOS-type semiconductor device of claim 1 wherein said insulator comprises an oxide thin layer.

4. The MOS-type semiconductor of claim 2, wherein said insulator comprises an oxide thin layer.

5. The MOS-type semiconductor of claim 1, wherein said insulator comprises an insulator formed by oxidation of a portion of said first semiconductor and wherein said second semiconductor has an atomically-flat surface bonded to said insulator.

6. The MOS-type semiconductor of claim 1, wherein said first semiconductor comprises an integrated circuit substrate and said second semiconductor comprises a gate electrode.

7. The MOS-type semiconductor of claim 1, wherein said insulator comprises tantalum oxide.

8. The MOS-type semiconductor of claim 1, wherein said first and second semiconductors comprise silicon electrodes.

9. The MOS-type semiconductor device of claim 8, wherein said insulator comprises an oxide thin layer.

10. The MOS-type semiconductor of claim 8, wherein said insulator comprises an insulator formed by oxidation of a portion of said first semiconductor and wherein said second semiconductor has an atomically-flat surface bonded to said insulator.

11. The MOS-type semiconductor of claim 8, wherein said first semiconductor comprises an integrated circuit substrate and said second semiconductor comprises a gate electrode.

12. The MOS-type semiconductor of claim 8, wherein the conductivity of at least a portion of said first semiconductor and said second semiconductor are altered by an added dopant.

13. The MOS-type semiconductor of claim 1, wherein said second semiconductor comprises germanium.

* * * * *